(12) United States Patent
Zhang et al.

(10) Patent No.: US 10,935,581 B2
(45) Date of Patent: Mar. 2, 2021

(54) ELECTRIC GRID STATE ESTIMATION SYSTEM AND METHOD BASED ON BOUNDARY FUSION

(71) Applicant: Northeastern University, Shenyang (CN)

(72) Inventors: Huaguang Zhang, Shenyang (CN); Jun Yang, Shenyang (CN); Jie Bai, Shenyang (CN); Gang Wang, Shenyang (CN); Qiuye Sun, Shenyang (CN); Xinrui Liu, Shenyang (CN); Yingchun Wang, Shenyang (CN); Dongsheng Yang, Shenyang (CN); Zhiliang Wang, Shenyang (CN); Bonan Huang, Shenyang (CN); Zhanshan Wang, Shenyang (CN); Yanhong Luo, Shenyang (CN)

(73) Assignee: NORTHEASTERN UNIVERSITY, Shenyang (CN)

( * ) Notice: Subject to any disclaimer, the term of this patent is extended or adjusted under 35 U.S.C. 154(b) by 173 days.

(21) Appl. No.: 16/120,907

(22) Filed: Sep. 4, 2018

(65) Prior Publication Data
US 2019/0293699 A1 Sep. 26, 2019

(30) Foreign Application Priority Data
Mar. 22, 2018 (CN) .......................... 201810239661.8

(51) Int. Cl.
*G01R 21/133* (2006.01)
(52) U.S. Cl.
CPC .............................. *G01R 21/1331* (2013.01)

(58) Field of Classification Search
CPC .. G01R 21/1331; G05B 13/042; G05B 17/02; G06F 17/10; G06F 30/20; H02J 13/0006; H02J 2203/20; H02J 3/00
See application file for complete search history.

(56) References Cited

U.S. PATENT DOCUMENTS

| 7,991,512 B2* | 8/2011 | Chandra ................ G06Q 10/06 700/291 |
| 10,418,832 B2* | 9/2019 | Wenzel .................... H02J 7/007 |
| 2014/0032187 A1* | 1/2014 | Legbedji ................. G06F 30/20 703/2 |

* cited by examiner

*Primary Examiner* — Elias Desta
(74) *Attorney, Agent, or Firm* — Muncy, Geissler, Olds & Lowe, P.C.

(57) ABSTRACT

The invention provides an electric grid state estimation system and method based on a boundary fusion. The system includes an electric grid data acquisition module, a communication module including a local data unit and a state estimation unit, and a data fusion module, wherein the state estimation unit includes a memory storing a state estimation program and a display displaying a program running and outputting a state variable; the state estimation program is performed to realize an electric grid state estimation; the estimation method includes the following steps of dividing a regional electric grid, then establishing a measurement equation for each region, solving an internal quantity and a boundary quantity, fusing the boundary quantities of two regions, correcting the boundary quantity, performing a non-linear transformation on the intermediate variable, solving the estimated values of the state variable by the least square method, and performing outputting.

5 Claims, 3 Drawing Sheets

ELECTRIC GRID STATE ESTIMATION SYSTEM AND METHOD BASED ON BOUNDARY FUSION

CROSS-REFERENCE TO RELATED APPLICATION

This application claims the priority of Chinese patent application No. 2018102396618, filed on Mar. 22, 2018, which is incorporated herewith by reference.

BACKGROUND OF THE INVENTION

1. Field of the Invention

The invention relates to the technical field of electric grid state estimation, in particular to an electric grid state estimation system and method based on a boundary fusion.

2. The Prior Arts

Nowadays, automation equipment is widely used, and is widely used in a power system. However, in recent years, the scale of the electric grid is expanded rapidly, the measurement values generated is increased a lot, and data to be transmitted is increased, so that the state estimation computing speed becomes slower and slower. The results obtained play an essential role in both electric grid operation and scheduling. Therefore, the requirements of the smart electric grid for the real-time control of the electric grid cannot be met. Therefore, how to increase the computing speed is a problem which needs to be solved by those skilled in the art at present.

In state estimation, a written program is used to process the data information sent by a monitoring device in real time, so that a reliable value that characterizes the system running state can be obtained, and the influences of various errors and interferences are minimized. A state estimation algorithm refers to a calculation method for obtaining the optimized state estimated value based on measured values under the condition of given network connection, branch parameters and measurement systems. The method is the core part of the state estimation program. Therefore, selection of the state estimation algorithm has a great influence on the performance of the entire state estimation program.

SUMMARY OF THE INVENTION

The invention aims to solve the technical problems that aiming at the defects existing in the prior art, the invention provides an electric grid state estimation system and method based on a boundary fusion so as to solve the problem that the state estimation computing speed in the prior art cannot meet the requirements of an intelligent electric grid for the real-time control of an electric grid.

In order to solve the technical problem, the technical scheme adopted by the invention lies in that on one hand, the invention provides an electric grid state estimation system based on the boundary fusion, and the electric grid state estimation system comprises an electric grid data acquisition module, a communication module and a data fusion module, wherein:

The electric grid data acquisition module comprises a plurality of data acquisition units, the number of which is the same as that of divided regions, and the data acquisition units are used for acquiring the measurement value of each node, including active power and reactive power of each node, and power of each branch;

The communication module comprises a plurality of data transmission units, the number of which is the same as that of the divided regions, and data collected by the data acquisition units is transmitted to the data fusion module by the data transmission units through a data transmitter; and The data fusion module comprises a local data unit and a state estimation unit, wherein the local data unit is used for storing electric grid network line parameters and a branch-node correlation matrix; the state estimation unit comprises a memory and a display, wherein the memory stores a computer-executable state estimation program based on the boundary fusion, wherein the program is executed to realize electric grid state estimation based on the boundary fusion; and the display is used for displaying a state estimated value run and output by the state estimation program based on the boundary fusion.

On the other hand, the invention further provides an electric grid state estimation method based on the boundary fusion, which is realized by adopting the electric grid state estimation system based on the boundary fusion, and the electric grid state estimation method comprises the following steps of:

Step 1: through division of a regional electric grid, dividing nodes in each region into boundary nodes and internal nodes;

Step 2: acquiring the measurement data of all nodes in each region through the data acquisition unit of each region, including the active power and reactive power of each node, and the power of each branch, and transmitting data collected by the data acquisition units to the data fusion module by the data transmission units through a data transmitter;

Step 3: for each regional electric grid, establishing a measurement equation for the divided region according to the relationship between the branch power and the node voltage amplitude, introducing an intermediate variable, and calculating the internal quantity and the boundary quantity respectively according to the divided node types;

Step 4: constructing a fusion matrix for the adjacent regions, applying an intelligent algorithm to fuse the boundary quantities of the two regions, and replacing the original boundary value with the fusion value;

Step 5: performing a non-linear transformation on the corrected intermediate variable for each region, and then obtaining a state variable estimated value by a least square method; and Step 6: outputting all state variable estimated values.

In the step 1, the step of dividing the regional electric grid comprises:

preliminarily dividing the electric grid into N regions by node tearing, and obtaining a region set $K=\{1, 2, \ldots, N\}$, wherein N is greater than or equal to 2;

adding one or more nodes in each region so that a common branch is formed between adjacent regions, and then completing the division of the regions; and according to the division of the regions, dividing the nodes into internal nodes and boundary nodes of the region, wherein the boundary nodes are nodes on the common branch.

The step 3 comprises:

for subregions $m, n \subseteq K$, establishing a measurement equation for the divided region m according to the relationship between the branch power and the node voltage amplitude, introducing an intermediate variable, as shown in the following formula:

$$Z_m = Ay_m + e = A[y_{m\_in} \text{Bond}_{m\_ab}]^T + e,$$

wherein $Z_m$ is the measurement value of the region m; A is a constant matrix; e is a measurement error vector; $y_m$ is an intermediate variable; $y_{m\_in}$ is the internal quantity of the region m; a and b are nodes on the common branch of the regions m and n; $\text{Bond}_{m\_ab}$ is the boundary quantity of the region m, which has the following expression form:

$$\text{Bond}_{m\_ab} = \begin{bmatrix} W_{ab} \\ S_{ab} \\ F_a \end{bmatrix} = \begin{bmatrix} V_a V_b \cos\theta_{ab} \\ V_a V_b \sin\theta_{ab} \\ V_a^2 \end{bmatrix};$$

wherein $V_a$ and $V_b$ are respectively the node voltages of a and b; $\theta_{ab} = \theta_a - \theta_b$ is the phase angle difference of the two nodes a and b;

for the region n, the boundary quantity is $\text{Bond}_{n\_ba}$, which has the following expression form:

$$\text{Bond}_{n\_ba} = \begin{bmatrix} W_{ba} \\ S_{ba} \\ F_b \end{bmatrix} = \begin{bmatrix} V_b V_a \cos\theta_{ba} \\ V_b V_a \sin\theta_{ba} \\ V_b^2 \end{bmatrix},$$

wherein $\theta_{ba} = \theta_b - \theta_a$ is the phase angle difference of the two nodes b and a.

The step 4 comprises:
defining a fusion vector fuse as below:

$$\text{fuse} = \begin{bmatrix} A_{ab} \\ B_{ab} \\ C_a \\ D_b \end{bmatrix};$$

wherein $A_{ab}$, $B_{ab}$, $C_a$ and $D_b$ are respectively four variables to be solved;
defining an objective function as below:

$$\min f = (|W_{ab}| - |A_{ab}|)^2 + (|W_{ba}| - |A_{ab}|)^2 + (|S_{ab}| - |B_{ab}|)^2 + (|S_{ba}| - |B_{ab}|)^2 + (C_a - F_a)^2 + (D_b - F_b)^2$$

s.t. $A_{ab}^2 + B_{ab}^2 = C_a D_b$ $\text{sgn}(A_{ab}) = \text{sgn}(W_{ab})$ $\text{sgn}(B_{ab}) = \text{sgn}(S_{ab})$ wherein sgn is a sign function;
solving the objective function by using the intelligent algorithm to obtain a fusion vector fuse;
premultiplying the fusion vector fuse by the matrices $T_{mn}$ and $T_{nm}$ to obtain the fusion boundary values $\text{Bond}^*_{m\_ab} = T_{mn}\text{fuse}$ and $\text{Bond}^*_{n\_ab} = T_{nm}\text{fuse}$, wherein $$T_{mn} = \begin{bmatrix} 1 & 0 & 0 & 0 \\ 0 & 1 & 0 & 0 \\ 0 & 0 & 1 & 0 \end{bmatrix};$$

$$T_{nm} = \begin{bmatrix} -1 & 0 & 0 & 0 \\ 0 & -1 & 0 & 0 \\ 0 & 0 & -1 & 0 \end{bmatrix};$$

returning the updated boundary values to each region so that an updated intermediate variable $y_{opt}$ is obtained, wherein the corresponding intermediate variables for the regions are respectively $y_{mopt}$ and $y_{nopt}$, and the specific expression forms are respectively as below:

$$y_{mopt} = [y_{m\_in}\text{Bond}^*_{m\_ab}]^T; \text{ and}$$

$$y_{nopt} = [y_{n\_in}\text{Bond}^*_{n\_ab}]^T.$$

The step 5 comprises:
performing the non-linear transformation on the updated intermediate variable $y_{opt}$, wherein the transformation form is as below:

$$y_{opt} \to L = \begin{bmatrix} \ln(W_{ij}^2 + S_{ij}^2) \\ \tan^{-1}\dfrac{S_{ij}}{W_{ij}} \\ \ln F_i \end{bmatrix} = \begin{bmatrix} 2\ln V_i + 2\ln V_j \\ \theta_i - \theta_j \\ 2\ln V_i \end{bmatrix};$$

wherein i and j are the numbers of nodes at two ends of any branch in the region;
enabling $\alpha_i = \ln F_i = 2\ln V_i$, $\theta_{ij} = \theta_i - \theta_j$ and $\alpha_{ij} = \alpha_i + \alpha_j$, then $L = [\alpha_{ij}, \theta_{ij}, \alpha_i]^T$;
enabling the form of a state variable x to be:

$$x = \begin{bmatrix} \alpha \\ \theta \end{bmatrix} \text{ then } \begin{bmatrix} \alpha_{ij} \\ \theta_{ij} \\ \alpha_i \end{bmatrix} = \begin{bmatrix} |G^T| & 0 \\ 0 & G_r^T \\ I & 0 \end{bmatrix} \begin{bmatrix} \alpha \\ \theta \end{bmatrix} + e_L$$

wherein $e_L$ is an error vector of the intermediate variable L; G is a branch-node correlation matrix; $G_r$ is a simplified matrix of G, which can be obtained by modifying each row of $|G^T|$ according to $\theta_{ij} = \theta_i - \theta_j$ and $\alpha_{ij} = \alpha_i + \alpha_j$;
solving the equation by a weighted least square method, wherein the solution is:

$$x = (J^T Q_m J)^{-1} J^T Q_m m,$$

wherein $$J = \begin{bmatrix} |G^T| & 0 \\ 0 & G_r^T \\ I & 0 \end{bmatrix},$$

$Q_m = (E^T)^{-1}\text{cov}^{-1}(y)E^{-1}$, and E is a jacobian matrix obtained by deriving L to y; and
transforming the obtained x so that the state variable estimated value of each node, namely the voltage V and the phase angle $\theta$, can be obtained.

The technical scheme has the beneficial effects that according to the electric grid state estimation system and method based on the boundary fusion provided by the invention, the electric grid is divided into a plurality of regions, and a measurement equation is established for each region according to the relationship between the node impedance and power, so that an intermediate variable is obtained and divided into internal quantity and boundary quantity; the boundary quantities of the adjacent regions are corrected by an intelligent algorithm, and the estimated value of each region can be obtained by the least square method through the non-linear transformation; through correction for the boundary quantities, the intermediate variable of each region is adjusted, and the estimated value of each region is adjusted indirectly; the method needs less communication volume, and compared with a centralized state estimation method, the method disclosed by the invention increases the computing speed of electric power state estimation without loss of accuracy.

DETAILED DESCRIPTION OF THE PREFERRED EMBODIMENT

The embodiments of the invention are described in details below with reference to the accompanying drawings and embodiments. The following embodiments are used to describe the invention but are not used to limit the scope of the invention.

Figure 1:
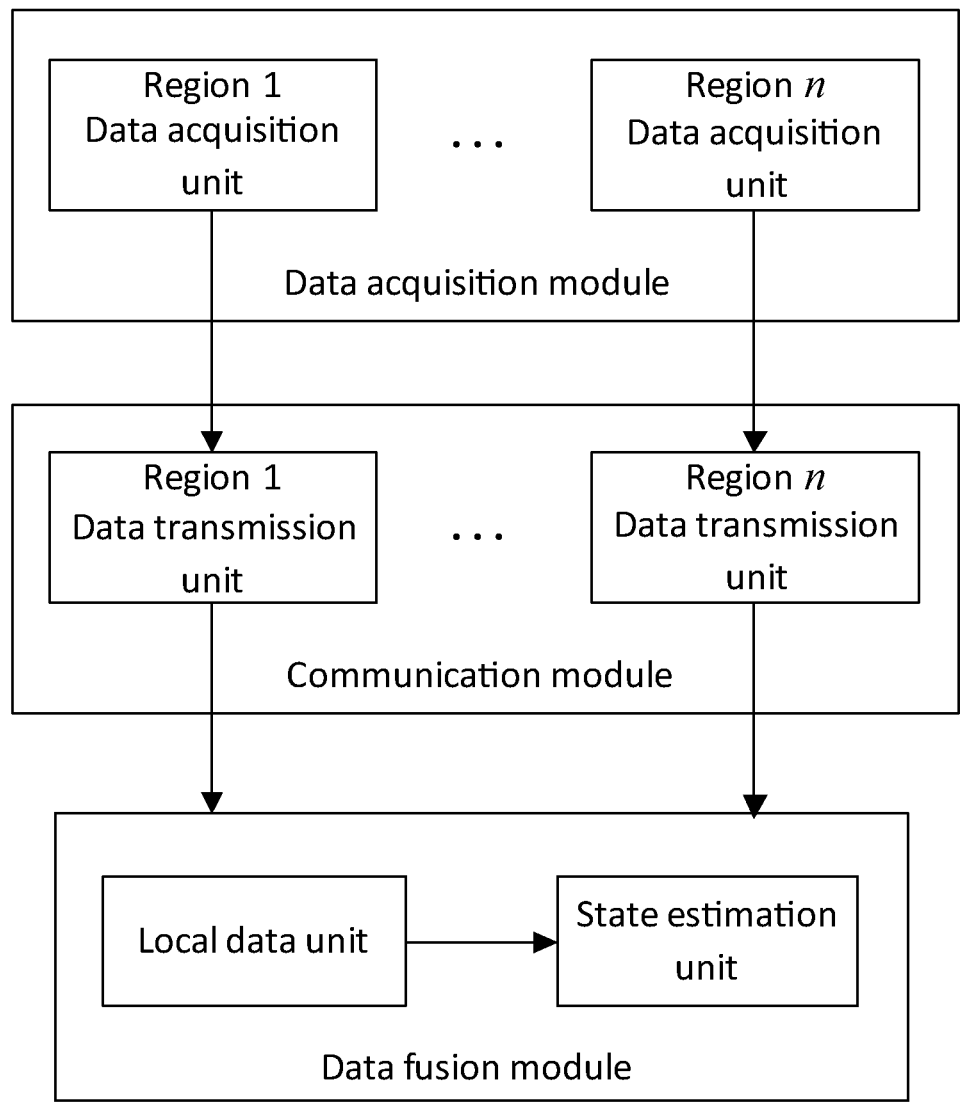
FIG. 1 is a structural block diagram of an electric grid state estimation system based on a boundary fusion provided by one embodiment of the invention.

An electric grid state estimation system based on a boundary fusion as shown in FIG. 1 comprises an electric grid data acquisition module, a communication module and a data fusion module, wherein:

The electric grid data acquisition module comprises a plurality of data acquisition units, the number of which is the same as that of divided regions, and the data acquisition units are used for acquiring the measurement value of each node, including active power and reactive power of each node, and power of each branch;

The communication module comprises a plurality of data transmission units, the number of which is the same as that of the divided regions, and data collected by the data acquisition units is transmitted to the data fusion module by the data transmission units through a data transmitter.

The data fusion module comprises a local data unit and a state estimation unit, wherein the local data unit is used for storing electric grid network line parameters and a branch-node correlation matrix; the state estimation unit comprises a memory and a display, wherein the memory stores a computer-executable state estimation program based on the boundary fusion, wherein the program is executed to realize an electric grid state estimation based on the boundary fusion; and the display is used for displaying a state estimated value run and output by the state estimation program based on the boundary fusion.

An electric grid state estimation method based on the boundary fusion, which is realized by adopting the electric grid state estimation system based on the boundary fusion, and specially comprises the following steps of:

Step 1: through division of a regional electric grid, dividing nodes in each region into boundary nodes and internal nodes.

Preliminarily dividing the electric grid into N regions by node tearing, and obtaining a region set K={1, 2, . . . , N}, wherein N is greater than or equal to 2; adding one or more nodes in each region so that a common branch is formed between adjacent regions, and then completing the division of the regions; according to the division of the regions, dividing the nodes into internal nodes and boundary nodes of the region, wherein the boundary nodes are nodes on the common branch.

Figure 2:
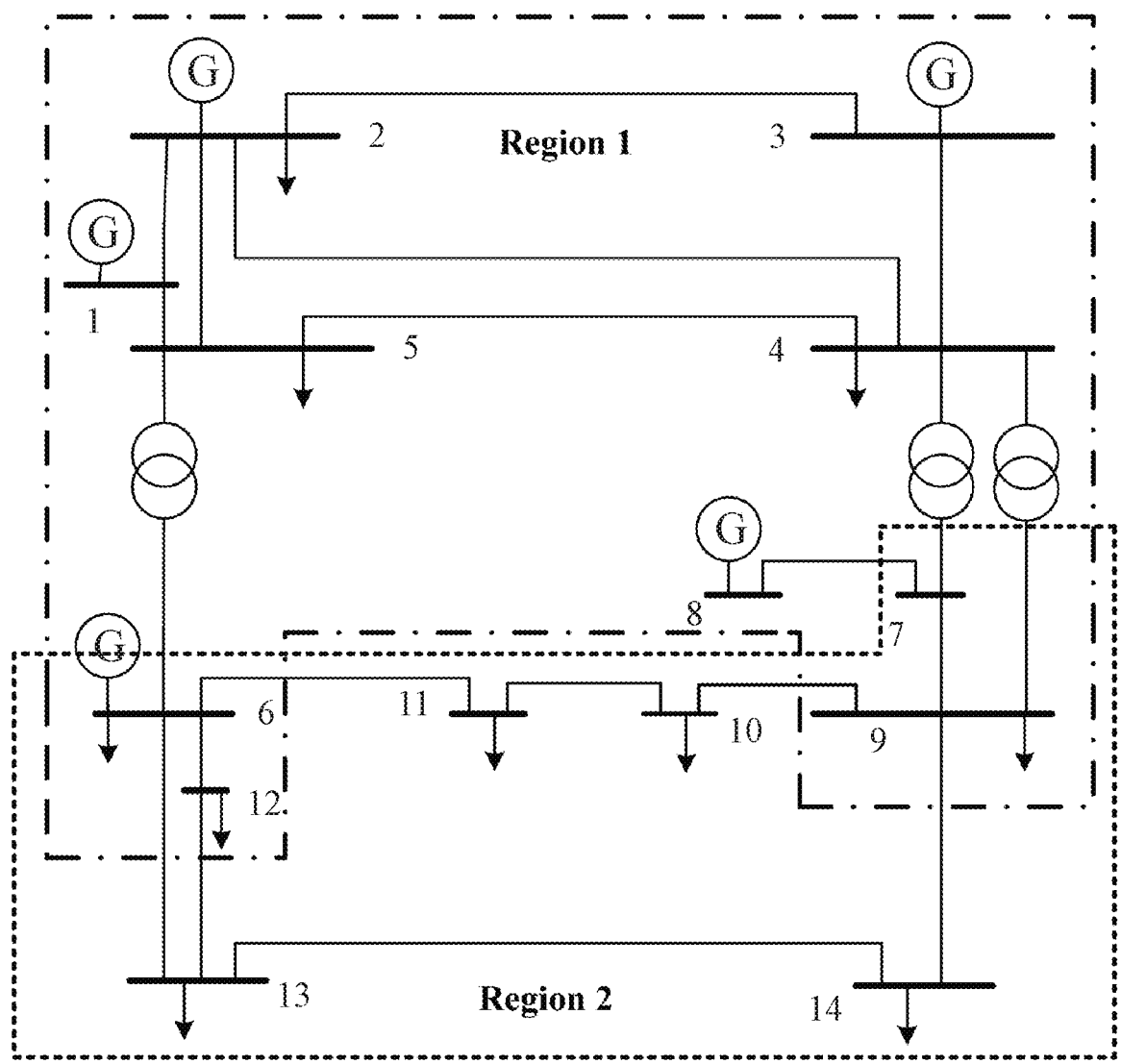
FIG. 2 is an IEEE14 node system after the division of regions provided by one embodiment of the invention.

In the embodiment, the electric grid is divided into two sub-regions, namely regions 1 and 2, and nodes 6, 7, 9, and 12 are boundary nodes, and FIG. 2 shows the IEEE14 node system after division of the regions.

Step 2: acquiring the measurement data $Z_i$ of all nodes in each region through the data acquisition unit of each region, including the active power and reactive power of each node, and the power of each branch, and transmitting data collected by the data acquisition units to the data fusion module by the data transmission units through a data transmitter.

Figure 3:
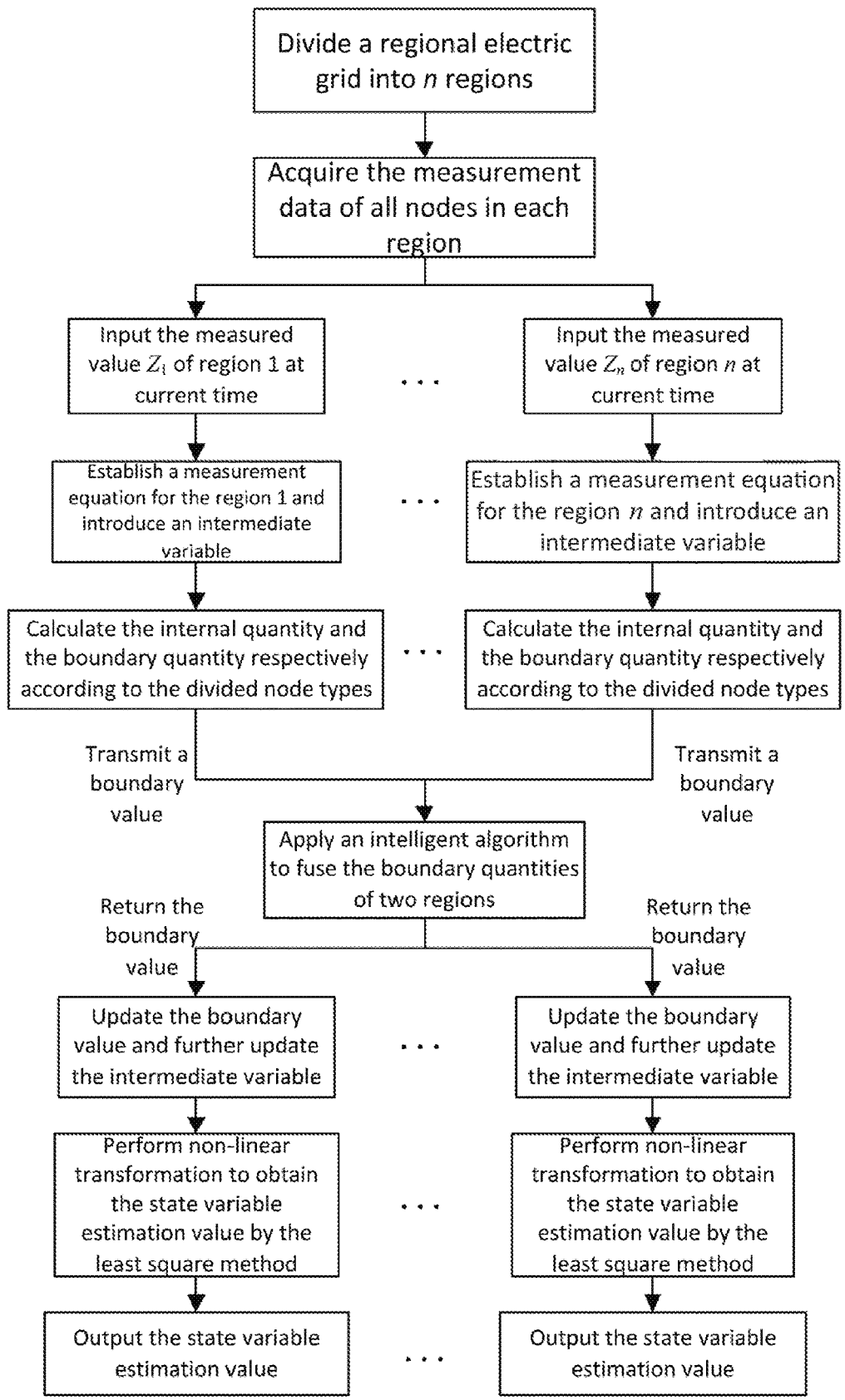
FIG. 3 is a flow chart of a state estimation process in the electric grid state estimation method based on the boundary fusion provided by one embodiment of the invention.

According to the measurement data $Z_i$ of the nodes in each region, a state estimation process of each region is performed in the state estimation unit of the data fusion module, and the flow chart of the estimation process is shown in FIG. 3, and the specific steps are described as below.

Step 3: for each regional electric grid, establishing a measurement equation for the divided region according to the relationship between the branch power and the node voltage amplitude, introducing an intermediate variable, and calculating an internal quantity and a boundary quantity respectively according to the divided node types.

The relations between the branch power and the node voltage and between the branch power and the phase angle are as below:

$$P_{ij} = V_i^2 g_{ij} - V_i V_j \cos\theta_{ij} g_{ij} + V_i V_j \sin\theta_{ij} b_{ij}$$

$$Q_{ij} = -V_i^2(b_{ij}+y_c) + V_i V_j \cos\theta_{ij} b_{ij} - V_i V_j \sin\theta_{ij} b_{ij}$$

wherein i and j are the number of nodes on any branch in the region; $g_{ij}$, $b_{ij}$ and $y_c$ are respectively the pi-mode equivalent circuit series conductance, series susceptance and ground susceptance of the branch ij, and $\theta_{ij}=\theta_i-\theta_j$ is a phase angle difference between two nodes; and $P_{ij}$ and $Q_{ij}$ are the active power and the reactive power on the branch ij;

enabling y to be $$y = \begin{bmatrix} W_{ij} \\ S_{ij} \\ F_i \end{bmatrix} = \begin{bmatrix} V_i V_j \cos\theta_{ij} \\ V_i V_j \sin\theta_{ij} \\ V_i^2 \end{bmatrix} \text{ then}$$

$$P_{ij} = F_i g_{ij} - W_{ij} g_{ij} + S_{ij} b_{ij}$$

$$Q_{ij} = -F_i(b_{ij}+y_c) + W_{ij} b_{ij} - S_{ij} g_{ij}$$

$$V_i^2 = F_i$$

from above, obtaining the measurement equation $$z = Ay + e$$

wherein z is a measurement vector, y is an intermediate variable, e is an error vector, and A is a constant coefficient matrix.

In the embodiment, for the region 1, a measurement equation is established for the divided region according to the relationship between the node voltage amplitude and the branch power:

$$Z_1 = Ay_1 + e = A[y_{1\_in}, \text{Bond}_{1\_79}, \text{Bond}_{1\_612}]^T + e$$

wherein $Z_1$ is measurement values in region 1, $y_{1\_in}$ is an internal quality, and of which the form is similar as that of Bond$_{1\_79}$, only numbers of nodes of subscript number are converted into numbers of nodes of internal nodes in the region 1; and Bond$_{1\_79}$ and Bond$_{1\_612}$ are boundary quantities, and Bond$_{1\_79}$ is as below:

$$Bond_{1\_79} = \begin{bmatrix} W_{79} \\ S_{79} \\ F_7 \end{bmatrix} = \begin{bmatrix} V_7 V_9 \cos\theta_{79} \\ V_7 V_9 \sin\theta_{79} \\ V_7^2 \end{bmatrix}$$

wherein nodes 7 and 9 are boundary nodes.

Similarly, in the region 2, $Bond_{2\_97}$ is as below:

$$Bond_{2\_97} = \begin{bmatrix} W_{97} \\ S_{97} \\ F_9 \end{bmatrix} = \begin{bmatrix} V_9 V_7 \cos\theta_{97} \\ V_9 V_7 \sin\theta_{97} \\ V_9^2 \end{bmatrix}.$$

In the region 1, the least square solution of equation $Z_1 = Ay_i + e$ is $$y_1 = (A^T W A)^{-1} A^T W Z_1$$

wherein W is a weighting matrix.

Step 4: constructing a fusion matrix for adjacent regions, applying a gravitation algorithm to fuse the boundary quantities of two regions, and replacing the original boundary value with the fusion value.

For the regions 1 and 2, defining a fusion vector fuse, establishing an objective function, and performing solving by the gravitation algorithm;

defining the fuse vector as:

$$\text{fuse} = \begin{bmatrix} A_{79} \\ B_{79} \\ C_7 \\ D_9 \end{bmatrix}$$

defining the objective function as:

$$\min f = (|W_{79}| - |A_{79}|)^2 + (|W_{97}| - |A_{79}|)^2 + (|S_{79}| - |B_{79}|)^2 + (|S_{97}| - |B_{79}|)^2 + (C_7 - F_7)^2 + (D_9 - F_9)^2$$

s.t. $A_{79}^2 + b_{79}^2 = C_7 D_9$ $sgn(A_{79}) = sgn(W_{79})$ $sgn(B_{79}) = sgn(S_{79})$ wherein sgn is a sign function, and nodes 7 and 9 are nodes in a common branch;

after solving by the gravitation algorithm, premultiplying the matrices $T_{12}$ and $T_{21}$ to enable $Bond^*_{1\_79} = T_{12}$fuse and $Bond^*_{2\_97} = T_{21}$fuse, wherein matrices $T_{12}$ and $T_{21}$ are specially as below:

$$T_{12} = \begin{bmatrix} 1 & 0 & 0 & 0 \\ 0 & 1 & 0 & 0 \\ 0 & 0 & 1 & 0 \end{bmatrix}$$

$$T_{21} = \begin{bmatrix} -1 & 0 & 0 & 0 \\ 0 & -1 & 0 & 0 \\ 0 & 0 & 1 & 0 \end{bmatrix}$$

Similarly, a consistent treatment is also made for nodes 6 and 12, so that $Bond^*_{1\_612}$ and $Bond^*_{2\_126}$ can be obtained.

The updated boundary values are returned to each region to obtain an updated intermediate variable;

In the region 1, the form of the intermediate variable $y_{1opt}$ is as below:

$$y_{1opt} = [y_{1\_in} Bond^*_{1\_79} Bond^*_{1\_612}]^T$$

Similarly, in the region 2, the form of the intermediate variable can be obtained as below:

$$y_{2opt} = [y_{2\_in} Bond^*_{2\_79} Bond^*_{2\_126}]^T.$$

Step 5: performing a non-linear transformation on the corrected intermediate variable for each region, and then obtaining a state variable estimated value by a least square method.

More specifically, performing the non-linear transformation on $y_{1opt}$ and $y_{2opt}$, enabling $$y_{opt} \rightarrow L = \begin{bmatrix} \ln(W_{ij}^2 + S_{ij}^2) \\ \tan^{-1}\dfrac{S_{ij}}{W_{ij}} \\ \ln F_i \end{bmatrix} = \begin{bmatrix} 2\ln V_i + 2\ln V_j \\ \theta_i - \theta_j \\ 2\ln V_i \end{bmatrix}$$

wherein i and j are the numbers of nodes at any branch in the region;

enabling $\alpha_i = \ln F_i = 2\ln V_i$, $\theta_{ij} = \theta_i - \theta_j$ and $\alpha_{ij} = \alpha_i + \alpha_j$, then $L = [\alpha_{ij}, \theta_{ij}, \alpha_i]^T$;

enabling the form of a state variable x to be:

$$x = \begin{bmatrix} \alpha \\ \theta \end{bmatrix},$$

enabling $$\begin{bmatrix} \alpha_{ij} \\ \theta_{ij} \\ \alpha_i \end{bmatrix} = \begin{bmatrix} |G^T| & 0 \\ 0 & G_r^T \\ I & 0 \end{bmatrix} \begin{bmatrix} \alpha \\ \theta \end{bmatrix} + e_L$$

wherein $e_L$ is an error vector of the intermediate variable L; G is a branch-node correlation matrix; $G_r$ is a simplified matrix of G, which can be obtained by modifying each row of $|G^T|$ according to $\theta_{ij} = \theta_i - \theta_j$ and $\alpha_{ij} = \alpha_i + \alpha_j$;

solving the equation by a weighted least square method, wherein the solution is:

$$x = (J^T Q_m J)^{-1} J^T Q_m m$$

wherein $$J = \begin{bmatrix} |G^T| & 0 \\ 0 & G_r^T \\ I & 0 \end{bmatrix},$$

$Q_m = (E^T)^{-1} \text{cov}^{-1}(y) E^{-1}$, and E is a jacobian matrix obtained by deriving L to y; and transforming the obtained x so that the state variable estimated value of each node, namely the voltage V and the phase angle θ can be obtained.

Step 6: outputting all state variable estimated values.

Finally, it should be noted that the above embodiments are only used to describe the technical scheme of the invention without limitation to the invention. Although the invention has been described in details with reference to the aforesaid embodiments, those skilled in the art should understand that modifications may be made to the technical schemes recorded in the aforesaid embodiments, or some or all of the technical characteristics therein may be equivalently substituted. Such modifications or substitutions should not deviate the nature of the corresponding technical scheme from the scope as defined by the attached claims.

What is claimed is:

1. An electric grid state estimation method based on a boundary fusion, realized by adopting an electric grid state estimation system based on the boundary fusion, the electric grid state estimation system based on the boundary fusion, comprising an electric grid data acquisition module, a communication module and a data fusion module, wherein:
   the electric grid data acquisition module comprises a plurality of data acquisition units, the number of which is the same as that of divided regions, and the data acquisition units are used for acquiring a measurement value of each node, including active power and reactive power of each node, and power of each branch;
   the communication module comprises a plurality of data transmission units, the number of which is the same as that of the divided regions, and data collected by the data acquisition units is transmitted to the data fusion module by the data transmission units through a data transmitter; and
   the data fusion module comprises a local data unit and a state estimation unit, wherein the local data unit is used for storing electric grid network line parameters and a branch-node correlation matrix; the state estimation unit comprises a memory and a display, wherein the memory stores a computer-executable state estimation program based on the boundary fusion, wherein the program is executed to realize an electric grid state estimation based on the boundary fusion; and the display is used for displaying a state estimated value run and output by the state estimation program based on the boundary fusion, the method comprising the following steps of:
   step 1: through division of a regional electric grid, dividing nodes in each region into boundary nodes and internal nodes;
   step 2: acquiring measurement data of all nodes in each region through the data acquisition unit of each region, including the active power and reactive power of each node, and the power of each branch, and transmitting data collected by the data acquisition units to the data fusion module by the data transmission units through the data transmitter;
   step 3: for each regional electric grid, establishing a measurement equation for the divided region according to the relationship between the branch power and the node voltage amplitude, introducing an intermediate variable, and calculating an internal quantity and a boundary quantity respectively according to the divided node types;
   step 4: constructing a fusion matrix for adjacent regions, applying an intelligent algorithm to fuse the boundary quantities of two regions, and replacing the original boundary value with the fused value;
   step 5: performing a non-linear transformation on the corrected intermediate variable for each region, and then obtaining a state variable estimated value by a least square method; and
   step 6: outputting all state variable estimated values.

2. The electric grid state estimation method based on the boundary fusion according to claim 1, wherein the step of dividing the regional electric grid in the step 1 comprises:
   preliminarily dividing the electric grid into N regions by node tearing, and obtaining a region set K={1, 2, ..., N}, wherein N is an integer greater than or equal to 2;
   adding one or more nodes in each region so that a common branch is formed between adjacent regions, and then completing the division of the regions; and
   according to the division of the regions, dividing the nodes into internal nodes and boundary nodes of the region, wherein the boundary nodes are nodes on the common branch.

3. The electric grid state estimation method based on the boundary fusion according to claim 2, wherein the step 3 comprises:
   for subregions m, n⊆K, establishing a measurement equation for the divided region m according to the relationship between the branch power and the node voltage amplitude, introducing an intermediate variable, as shown in the following formula:

$$Z_m = Ay_m + e = A[y_{m\_in} \text{Bond}_{m\_ab}]^T + e,$$

wherein $Z_m$ is the measurement value of the region m; A is a constant matrix; e is a measurement error vector; $y_m$ is an intermediate variable; $y_{m\_in}$ is an internal quantity of the region m; a and b are nodes on the common branch of the regions m and n; $\text{Bond}_{m\_ab}$ is a boundary quantity of the region m, which has the following expression form:

$$\text{Bond}_{m\_ab} = \begin{bmatrix} W_{ab} \\ S_{ab} \\ F_a \end{bmatrix} = \begin{bmatrix} V_a V_b \cos \theta_{ab} \\ V_a V_b \sin \theta_{ab} \\ V_a^2 \end{bmatrix};$$

wherein $V_a$ and $V_b$ are respectively the node voltages of a and b; $\theta_{ab} = \theta_a - \theta_b$ is the phase angle difference of the two nodes a and b;
   for the region n, the boundary quantity is $\text{Bond}_{n\_ba}$, which has the following expression form:

$$\text{Bond}_{n\_ba} = \begin{bmatrix} W_{ba} \\ S_{ba} \\ F_b \end{bmatrix} = \begin{bmatrix} V_b V_a \cos \theta_{ba} \\ V_b V_a \sin \theta_{ba} \\ V_b^2 \end{bmatrix};$$

wherein $\theta_{ba} = \theta_b - \theta_a$ is the phase angle difference of the two nodes b and a.

4. The electric grid state estimation method based on the boundary fusion according to claim 3, wherein the step 4 comprises:
   defining a fusion vector fuse as below:

$$\text{fuse} = \begin{bmatrix} A_{ab} \\ B_{ab} \\ C_a \\ D_b \end{bmatrix};$$

wherein $A_{ab}$, $B_{ab}$, $C_a$ and $D_b$ are respectively four variables to be solved;
   defining an objective function as below:

$$\min f = (|W_{ab}| - |A_{ab}|)^2 + (|W_{ba}| - |A_{ab}|)^2 + (|S_{ab}| - |B_{ab}|)^2 + (|S_{ba}| - |B_{ab}|)^2 + (C_a - F_a)^2 + (D_b - F_b)^2$$

$$\text{s.t. } A_{ab}^2 + B_{ab}^2 = C_a D_b$$

$$\text{sgn}(A_{ab}) = \text{sgn}(W_{ab})$$

$$\text{sgn}(B_{ab}) = \text{sgn}(S_{ab})$$

wherein sgn is a sign function;

solving the objective function by using the intelligent algorithm to obtain the fusion vector fuse; premultiplying the fusion vector fuse by matrices $T_{mn}$ and $T_{nm}$ to obtain fusion boundary values $\text{Bond}^*_{m\_ab} = T_{mn}\text{fuse}$ and $\text{Bond}^*_{n\_ab} = T_{nm}\text{fuse}$, wherein $$T_{mn} = \begin{bmatrix} 1 & 0 & 0 & 0 \\ 0 & 1 & 0 & 0 \\ 0 & 0 & 1 & 0 \end{bmatrix};$$

$$T_{nm} = \begin{bmatrix} -1 & 0 & 0 & 0 \\ 0 & -1 & 0 & 0 \\ 0 & 0 & -1 & 0 \end{bmatrix};$$

returning the updated boundary values to each region so that an updated intermediate variable $y_{opt}$ is obtained, wherein the corresponding intermediate variables for the regions m, n are respectively $y_{mopt}$ and $y_{nopt}$, and the specific expression forms are respectively as below:

$$y_{mopt} = [y_{m\_in} \text{Bond}^*_{m\_ab}]^T; \text{ and}$$

$$y_{nopt} = [y_{n\_in} \text{Bond}^*_{n\_ab}]^T.$$

5. The electric grid state estimation method based on the boundary fusion according to claim 4, wherein the step 5 comprises:

performing the non-linear transformation on the updated intermediate variable $y_{opt}$, wherein the transformation form is as below:

$$y_{opt} \rightarrow L = \begin{bmatrix} \ln(W_{ij}^2 + S_{ij}^2) \\ \tan^{-1} \dfrac{S_{ij}}{W_{ij}} \\ \ln F_i \end{bmatrix} = \begin{bmatrix} 2\ln V_i + 2\ln V_j \\ \theta_i - \theta_j \\ 2\ln V_i \end{bmatrix};$$

wherein i, j are the numbers of nodes at two ends of any branch in the region; enabling $\alpha_i = \ln F_i = 2\ln V_i$, $\theta_{ij} = \theta_i - \theta_j$ and $\alpha_{ij} = \alpha_i + \alpha_j$, then $L = [\alpha_{ij}, \theta_{ij}, \alpha_i]^T$;

enabling the form of a state variable x to be $$x = \begin{bmatrix} \alpha \\ \theta \end{bmatrix}, \text{ then } \begin{bmatrix} \alpha_{ij} \\ \theta_{ij} \\ \alpha_i \end{bmatrix} = \begin{bmatrix} |G^T| & 0 \\ 0 & G_r^T \\ I & 0 \end{bmatrix} \begin{bmatrix} \alpha \\ \theta \end{bmatrix} + e_L$$

wherein $e_L$ is an error vector of the intermediate variable L; G is a branch-node correlation matrix; $G_r$ is a simplified matrix of G, which can be obtained by modifying each row of $|G^T|$ according to $\theta_{ij} = \theta_i - \theta_j$ and $\alpha_{ij} = \alpha_i + \alpha_j$;

solving the equation by a weighted least square method, wherein the solution is:

$$x = (J^T Q_m J)^{-1} J^T Q_m m$$

wherein $$J = \begin{bmatrix} |G^T| & 0 \\ 0 & G_r^T \\ I & 0 \end{bmatrix},$$

$Q_m = (E^T)^{-1} \text{cov}^{-1}(y) E^{-1}$, and E is a jacobian matrix obtained by deriving L to y; and transforming the obtained x so that the state variable estimated value of each node, namely the voltage V and the phase angle θ, can be obtained.

\* \* \* \* \*